United States Patent [19]

Goldsmith

[11] Patent Number: 5,062,080

[45] Date of Patent: Oct. 29, 1991

[54] METHOD AND APPARATUS FOR ENABLING A MEMORY

[75] Inventor: Eric S. Goldsmith, Watauga, Tex.

[73] Assignee: Motorola, Inc., Schaumburg, Ill.

[21] Appl. No.: 82,717

[22] Filed: Aug. 3, 1987

[51] Int. Cl.$^5$ .......................................... G11C 13/00
[52] U.S. Cl. ........................... 365/230.01; 365/189.01
[58] Field of Search ............... 365/189, 230, 154, 221, 365/239, 189.01, 230.01, 201

[56] References Cited

U.S. PATENT DOCUMENTS

| | | | |
|---|---|---|---|
| 4,120,048 | 10/1978 | Fuhrman | 365/239 |
| 4,710,898 | 12/1987 | Sumi | 365/189 |
| 4,724,531 | 2/1988 | Angleton et al. | 365/189 |

*Primary Examiner*—Terrell W. Fears
*Attorney, Agent, or Firm*—Steven G. Parmelee; John W. Hayes

[57] ABSTRACT

A method and device for enabling writes to a memory unit. The memory write device, such as a microprocessor (11), must provide a predetermined sequence of addresses to an address decoding unit (13), which then passes along the decoded addresses to a memory write enable unit (14). If the correct sequence, and only the correct sequence, is so provided, the memory write enable unit (14) will provide an enable signal (16) to the memory (12), thereby allowing the microprocessor (11) to write to the memory (12). A timer (26) can be utilized to limit the enable window.

4 Claims, 2 Drawing Sheets

METHOD AND APPARATUS FOR ENABLING A MEMORY

TECHNICAL FIELD

This device relates generally to enablement of memory units.

BACKGROUND ART

Various computing devices, such as microprocessors, typically include a plurality of data and address ports that allow the microprocessor to store information in an associated memory at predetermined address locations. In many applications, the memory device will be an electrically eraseable programmable read-only memory (EEPROM). EEPROMs are convenient to use because they can receive and retain information from the microprocessor, and can even retain that information in the absence of power.

Most such memory units include a write enable port that controls when the memory unit can receive and store information. This provides protection against improper data being stored in the memory unit, or disruption of previously stored information. Unfortunately, there do arise circumstances when the write enable port can be incorrectly enabled, thereby allowing the guarded against events to occur. For instance, in automotive applications, various transient events can occur in the power supply lines of an onboard system. Such transient events can sufficiently disrupt system operations to improperly enable the memory unit as described above and thereby derogate the stored information.

In an attempt to avoid such inappropriate writes, some EEPROM manufacturers require that a predetermined data pattern be written to a fixed address prior to enabling memory writes. Another approach has provided a plurality of one shot circuits requiring receipt of a number of clock pulses in a predetermined amount of time before EEPROM writes will be enabled. To date, however, these approaches have either been relatively expensive, or are not compatible with all EEPROM designs. A need therefore exists for an effective, easily implemented, widely compatible memory write protection method and device for such memory units.

SUMMARY OF THE INVENTION

These needs and others are substantially met through provision of the method and device described herein for enabling a memory unit. Pursuant to this invention, an address decoding unit and a memory write enable unit are provided for use with a memory write unit (such as a microprocessor) and a memory unit (such as an EEPROM). To enable writes to the EEPROM, the memory write unit provides address information in a predetermined sequence to the address decoding unit, which decodes the address and provides an output related to that address information to the memory write enable unit. The memory write enable unit determines whether the proper sequence of addresses has been initially provided by the microprocessor. If the proper predetermined sequence has been so provided, the memory write enable unit provides an enable signal to the memory and thereby allows the microprocessor to write to the memory.

In one embodiment, the address decoding unit can be simply provided through appropriate logic gates to yield an appropriate output signal when the correct address appears at the inputs thereof. In another embodiment, the memory write enable unit can be provided by a plurality of "D" type flip-flops, which consecutively provide an appropriate signal at the data inputs thereof as the flip-flops are serially clocked through sequential provision of appropriate clock signals as provided thereto by the address decoding unit.

In another embodiment, a timer can be provided to only cause the memory unit to be enabled for no more than a predetermined period of time following initial enablement, thereby reducing the period of vulnerability.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein.

BEST MODE FOR CARRYING OUT THE INVENTION

Figure 1:
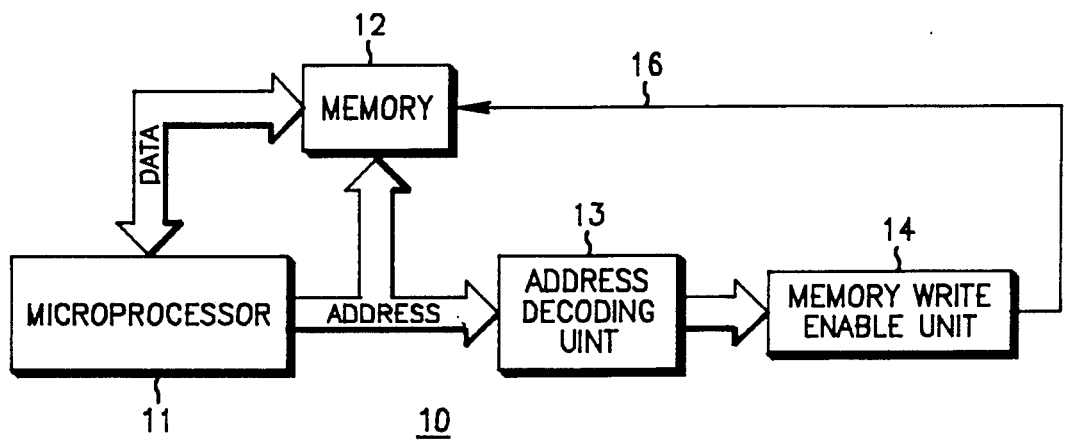
FIG. 1 comprises a block diagram depiction of the invention.

Referring now to the drawings, and in particular to FIG. 1, the invention can be seen as generally depicted by the numeral 10. The invention (10) operates in conjunction with a memory write unit, such as a microprocessor (11), and a memory, such as an EEPROM (12), and includes an address decoding unit (13) and a memory write enable unit (14). The microprocessor (11) provides address informaton to both the address decoding unit (13) and to the memory (12), the latter in conformance with well understood prior art technique. Further, the microprocessor (11) can provide and receive, as appropriate, data to and from the memory (12) as also well understood in the art. The address information is decoded in the address decoding unit (13), and appropriate decoded signals are provided to the memory write enable unit (14). Presuming that the appropriate sequence of addresses has been provided to the address decoding unit (13), the memory write enable unit (14) will provide an enable signal (16) to the memory (12), to thereby allow the memory (12) to receive and store data from the microprocessor (11).

Each of the above referred to components will now be described in more detail in seriatim fashion.

Figure 2:
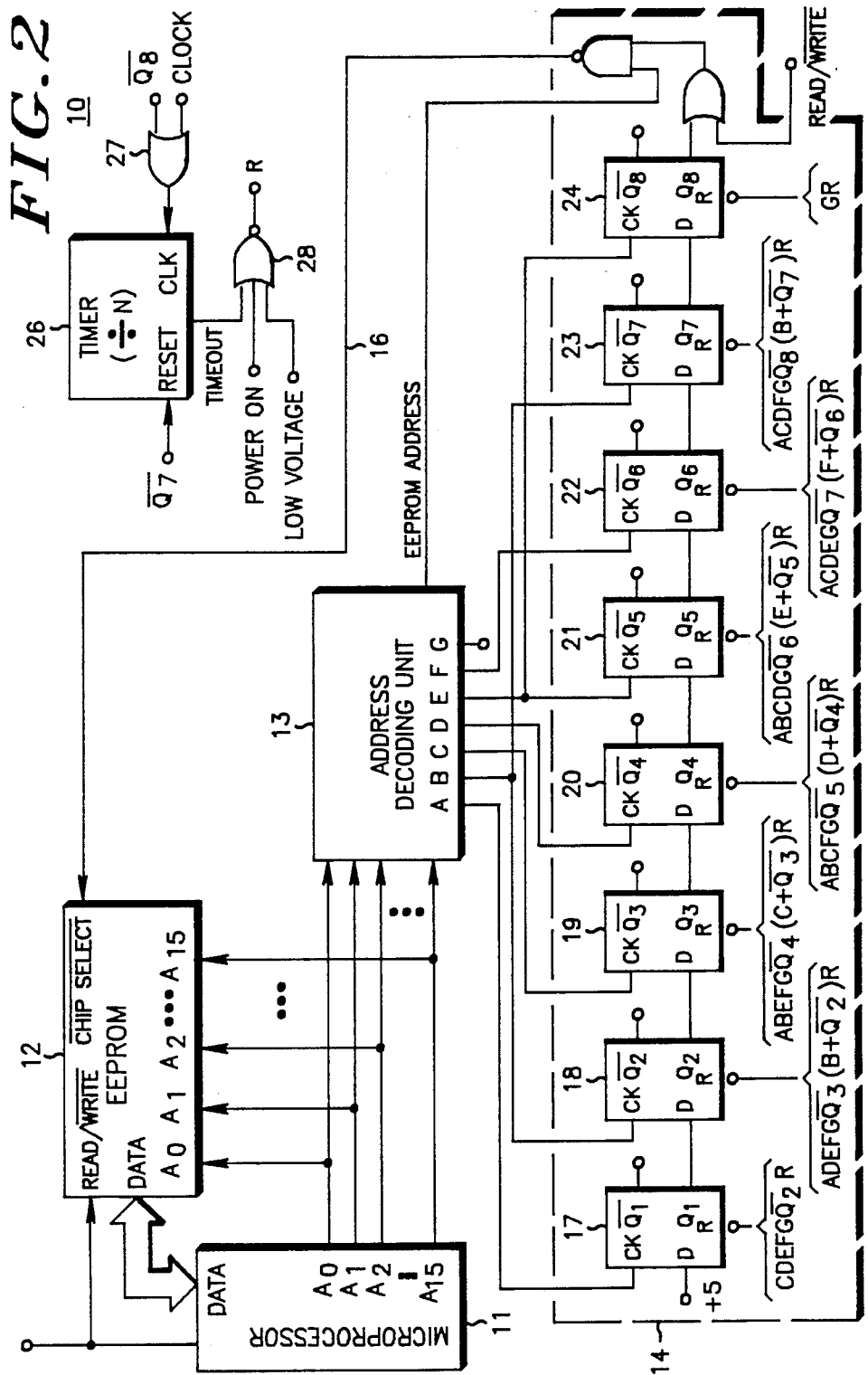
FIG. 2 comprises a more detailed schematic depiction of the invention.

Referring now to FIG. 2, the microprocessor (11) can be any appropriate microprocessor, microcomputer, or other mechanism capable of serving as a memory write unit. In the embodiment depicted, the microprocessor (11) has 16 address ports (AO-A15). These address ports are appropriately connected to the corresponding address ports of an EEPROM (12). In addition, these address ports connect to an address decoding unit (13), which will be described in more detail below. It should be understood that the address decoding unit (13) need not necessarily receive and respond to all of the available address lines. In this embodiment, however, the highest degree of security can be obtained by making use of every available address line.

The address decoding unit (13) has 7 outputs (A-G). Each output corresponds to at least one unique address, as will be explained in more detail below. These outputs are then appropriately provided to the memory write enable unit (14).

The memory write enable unit is essentially comprised of a plurality of flip-flops (17-24). The first flip-flop (17) has its data port connected to a positive 5 volt reference source, and its clock port connected to the first output (A) of the address decoding unit (13). So configured, the first flip-flop will clock upon receipt of an "A" signal, and transfer the signal appearing at its data port to its output (Q1). The output (Q1) of the first flip-flop (17) connects to the data port of the second flip-flop (18), which second flip-flop (18) will again transfer this information to its output (Q2) upon receipt of a clock pulse from the second output (B) of the address decoding unit (13). This process continues in a similar fashion until finally the output of the 7th flip-flop (23) passes from the data port input of the 8th flip-flop (24) to the output (Q8) thereof, which output supports the enable signal (16) that is provided to the chip select port of the EEPROM (12).

In the embodiment depicted, the flip-flops will sequentially switch only when the address decoding unit (13) provides the following outputs in the following order: A, B, C, D, E, F, B, and E. In addition, it can be seen that the reset port for each flip-flop (17-24) connects to a plurality of other signal sources, such that the flip-flops can be reset, and thereby terminate the enabling process, should any signal appear out-of-order. For instance, and by way of example, the second flip-flop (18) will reset even though an appropriate clock signal (B) appears at its clock input if the "A" signal has not first ceased. Furthermore, a subsequent appearance of the "A" signal any time subsequent to switching of the first flip-flop (17) will reset any of the 2nd through the 7the flip-flops (18–23), since appearance of the "A" output during this period of time would be indicative of a nonsequential event, and therefore raise suspicion regarding the validity of the enabling procedure.

As can also be seen in FIG. 2, a timer (26) can optionally be provided, which timer (26) can have a reset connected to the 7th flip-flop (23) and a clock input connected through an OR gate (27) to a clock source and the last and final flip-flop (24), and provide an output signal in response thereto when the timer has concluded. This output signal can be provided as a reset signal (R) to all of the flip-flops (17-24). In the embodiment depicted, an OR gate (28) has been provided such that suitable signal criteria (such as power on or low voltage) can also be used to terminate the enabling process through resetting of the flip-flops (17-24).

It should be understood that the number of flip-flops utilized may be determined in any particular application as to the level of security required In general, however, there should be at least a first flip-flop and at least another and last flip-flop, such that there would always be at least two flip-flops.

Figure 3:
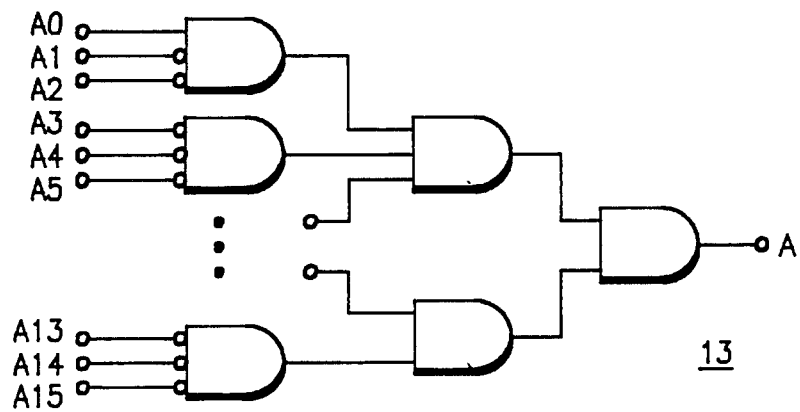
FIG. 3 comprises a schematic depiction of the address decoding unit.

Referring now to FIG. 3, the address decoding unit (13) could be realized in a variety of ways, as well understood in the art. For example, all 16 address ports (A15-AO) could be appropriately connected to AND gates as depicted, such that only the address location "0000000000000001" would yield the output "A" as required to clock the first flip-flop (17) of the memory write enable unit (14). In a similar way, other logic gates could be utilized to ensure that other unique address locations would give rise to the remaining signals (B-G) required in the embodiment depicted. Of course, the logic gates could be configured to allow a variety of addresses to give rise to the desired outputs, but this would reduce the security offered and therefore should be avoided.

In effect, then, in order to write to the EEPROM (12), the microprocessor (11) must first provide a sequential series of correct addresses in order to cause the EEPROM (12) to become selected Such a technique is compatible with all known EEPROMs and other memory devices, and can be simply and cheaply realized in integrated circuit form. The quality of security provided is high, and false writes are virtually eliminated.

Those skilled in the art will recognize that various modifications to the invention could be made without departing from the spirit and scope of the invention. It should therefore be specifically understood that the invention is not to be considered as being limited to the precise embodiments set forth, in the absence of specific limitations directed to such embodiments.

I claim:

1. A device for use with;
   a memory write unit having data output means for providing data and address output means for providing address location information; and
   a memory operably connected to said data output means and said address output means for storing data from said memory write unit at locations related to said address location information, when enabled;
   said device comprising:
   a) address decoding means operably connected to said address output means for providing an output related to said address location information; and
   b) memory write enable means for receiving said output from said address decoding means and for providing an enable signal to said memory means only when a predetermined proper sequence of address locations has been output by said memory write unit.

2. The device of claim 1 wherein said memory write enable means comprises a plurality of flip-flops that are sequentially triggered provided that said memory write unit provides a predetermined sequence of said address location information to said address decoding means.

3. The device of claim 2 wherein at least some of said plurality of flip-flops are reset if said sequence at least begins, but said address location information does not remain in said predetermined sequence.

4. The device of claim 1 and further including timer means for terminating provision of said enable signal within a predetermined period of time of providing said enable signal to said memory means.

* * * * *